US008829772B2

United States Patent
Son et al.

(10) Patent No.: US 8,829,772 B2
(45) Date of Patent: Sep. 9, 2014

(54) ORGANIC LIGHT EMITTING DIODE DISPLAY WITH HEAT DISSIPATING ADHESIVE

(75) Inventors: Jung-Hyun Son, Yongin (KR); Hoon Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 40 days.

(21) Appl. No.: 13/335,691

(22) Filed: Dec. 22, 2011

(65) Prior Publication Data

US 2012/0313499 A1  Dec. 13, 2012

(30) Foreign Application Priority Data

Jun. 13, 2011 (KR) ........................ 10-2011-0057100

(51) Int. Cl.
 *H01L 51/52*  (2006.01)
(52) U.S. Cl.
 CPC .......... *H01L 51/529* (2013.01); *H01L 51/5246* (2013.01)
 USPC ............................................ 313/46; 313/512
(58) Field of Classification Search
 USPC ........................................... 313/46, 495–512
 See application file for complete search history.

(56) References Cited

U.S. PATENT DOCUMENTS

| 2004/0032209 A1* | 2/2004 | Wu et al. ........................ 313/512 |
| 2008/0018231 A1* | 1/2008 | Hirakata ........................ 313/498 |
| 2011/0297996 A1* | 12/2011 | van den Brand et al. ....... 257/99 |

FOREIGN PATENT DOCUMENTS

| EP | 2144290 A1 * | 1/2010 |
| JP | 2009-129723 A | 6/2009 |
| KR | 1020070033228 A | 3/2007 |
| KR | 1020080006304 A | 1/2008 |
| KR | 1020080050000 A | 6/2008 |
| KR | 1020100017043 A | 2/2010 |

\* cited by examiner

*Primary Examiner* — Nimeshkumar Patel
*Assistant Examiner* — Jacob R Stern
(74) *Attorney, Agent, or Firm* — Knobbe Martens Olson & Bear, LLP

(57) ABSTRACT

Provided is an organic light emitting diode (OLED) display including: a substrate; an organic light emitting element disposed on the substrate; an encapsulation substrate disposed on the organic light emitting element; and an adhesive layer disposed on the substrate to cover the organic light emitting element and bonding the substrate including the organic light emitting element disposed therein with the encapsulation substrate. Herein, the adhesive layer is formed by laminating a filling adhesive sheet including at least one opening that is open in a vertical direction in a thickness of the adhesive layer with a heat dissipation adhesive sheet filling the opening, or by laminating a heat dissipation adhesive sheet including at least one opening that is open in a vertical direction in a thickness of the adhesive layer with a filling adhesive sheet filling the opening.

16 Claims, 2 Drawing Sheets

ORGANIC LIGHT EMITTING DIODE DISPLAY WITH HEAT DISSIPATING ADHESIVE

CROSS-REFERENCE TO RELATED APPLICATIONS

This application claims priority to and the benefit of Korean Patent Application No. 10-2011-0057100 filed in the Korean Intellectual Property Office on Jun. 13, 2011, the entire contents of which are incorporated herein by reference.

BACKGROUND

1. Field

An organic light emitting diode (OLED) display is provided.

2. Description of the Related Technology

Since an organic light emitting diode (OLED) display has light emitting characteristic and does not require a separate light source unlike a liquid crystal display (LCD), the thickness and the weight may be reduced. And, since an organic light emitting diode (OLED) display exhibits high definition characteristics such as low power consumption, high luminance and high reaction speed, and the like, it is spotlighted as the next generation display device for a portable electronic device.

An organic light emitting diode (OLED) display includes a plurality of organic light emitting elements having a hole injection electrode, an organic emission layer, and an electron implant electrode. In the organic emission layer, light emitting is achieved by energy generated when exitons produced by combination of electrons and holes drop from the exited state to the ground state, and the organic light emitting diode (OLED) display forms an image therewith.

However, since the organic emission layer is sensitive to the external environment such as moisture or oxygen, if the organic emission layer is exposed to moisture and oxygen, quality of the organic light emitting diode (OLED) display may be deteriorated. Therefore, to protect the organic light emitting element and prevent penetration of moisture or oxygen in the organic emission layer, an encapsulation substrate is bonded on the display substrate on which the organic light emitting element is formed by an additional sealing process, or a protection layer with a thin thickness is formed on the organic light emitting element.

However, if an encapsulation substrate is used or a protection layer is formed, to completely prevent penetration of moisture or oxygen in the organic emission layer, the manufacturing process of the organic light emitting diode (OLED) display may become complicated and simultaneously, it is difficult to form the organic light emitting diode (OLED) display with a thin thickness.

SUMMARY

One embodiment provides an organic light emitting diode (OLED) display that may effectively suppress moisture or oxygen penetration, may be manufactured by a simple process, and has improved yield.

Another embodiment provides a method for manufacturing the organic light emitting diode (OLED) display.

According to one embodiment, an organic light emitting diode (OLED) display is provided that includes a substrate; an organic light emitting element disposed on the substrate; an encapsulation substrate disposed on the organic light emitting element; and an adhesive layer disposed on the substrate to cover the organic light emitting element and bonding the substrate including the organic light emitting element disposed therein with the encapsulation substrate, wherein the adhesive layer is formed by laminating a filling adhesive sheet including at least one opening that is open in a vertical direction in a thickness of the adhesive layer with a heat dissipation adhesive sheet filling the opening, or by laminating a heat dissipation adhesive sheet including at least one opening that is open in a vertical direction in a thickness of the adhesive layer with a filling adhesive sheet filling the opening.

The opening may have a cross-section of about 0.01 to 5 $cm^2$.

The opening may have a cross-section of triangle, quadrangle, pentagon, hexagon, octagon, circle or a combination thereof.

The area of the cross-section of the opening occupying in a cross-section of the filling adhesive sheet or the heat dissipation adhesive sheet may range from about 10% to about 80% of the filling adhesive sheet or heat dissipation adhesive sheet.

The heat dissipation adhesive sheet may include at least one heat dissipation material selected from the group consisting of $Al_2O_3$, graphite, carbon nanotube (CNT), and graphite.

The filling adhesive sheet may include at least one filling material selected from the group consisting of talc, silica, magnesium oxide, mica, montmorillonite, alumina, graphite, beryllia (beryllium oxide), aluminum nitride, silicon carbide, mullite, and silicon.

The heat dissipation material or the filling material may have a particle diameter of about 10 nm to about 20 μm, respectively.

The heat dissipation material or the filling material may be mesoporous, plate-shaped, spherical, rod-shaped, fiber-shaped, or core-shell typed.

The adhesive layer may include thermally curable resin or photocurable resin.

The heat dissipation sheet and the filling adhesive sheet may include the same kind of thermally curable resin or photocurable resin so that the adhesive layer may be formed as one integrated sheet without forming an interface between the heat dissipation sheet and the filling adhesive sheet.

The heat dissipation adhesive sheet may include about 100 parts by weight of a thermally curable resin or photocurable resin; and about 5 to about 50 parts by weight of a heat dissipation material.

The filling adhesive sheet may include about 100 parts by weight of a thermally curable resin or photocurable resin; and about 5 to about 50 parts by weight of a filling material.

The adhesive layer may have a thickness of about 5 μm to about 50 μm.

The heat dissipation adhesive sheet may include a heat dissipation material, the filling adhesive sheet may include a filling material, and the heat dissipation material and filling material may be present at a weight ratio of about 10:1 to about 1:10 in the adhesive layer.

According to another embodiment, a method for manufacturing an organic light emitting diode (OLED) display is provided that include: providing an organic light emitting element on a substrate; punching one of a filling adhesive sheet and a heat dissipation adhesive sheet to form an opening and removing the inside of an opening; blanking the other of a heat dissipation adhesive sheet and a filling adhesive sheet to oppositely correspond to the opening of the one of the filling adhesive sheet and the heat dissipation adhesive sheet, and removing an exterior of the part corresponding to the opening in such a manner that protrusions and depressions of the heat dissipation adhesive sheet are engaged with protrusions and depressions of the filling adhesive sheet; forming an adhesive layer by laminating the filling adhesive sheet and the heat dissipation adhesive sheet that are punched or blanked in such a manner that the protrusions and depressions of the heat dissipation adhesive sheet are engaged with the protrusions and depressions of the filling adhesive sheet; and interposing the adhesive layer between the substrate including the organic light emitting element formed therein and an encapsulation substrate and bonding the substrate including the organic light emitting element formed therein with the encapsulation substrate.

The filling adhesive sheet or the heat dissipation adhesive sheet may be cut through a punching process, a blanking process or a combination thereof.

The method of claim may further include: curing the adhesive layer after the substrate including the organic light emitting element formed therein and the encapsulation substrate are bonded with the adhesive layer interposed therebetween.

After forming the adhesive layer on the encapsulation substrate, bonding with the substrate on which the organic light emitting element is formed may be carried out by a lamination process, a press process or a diaphragm process.

The organic light emitting diode (OLED) display has excellent life-span characteristic.

DETAILED DESCRIPTION

Figure 1:
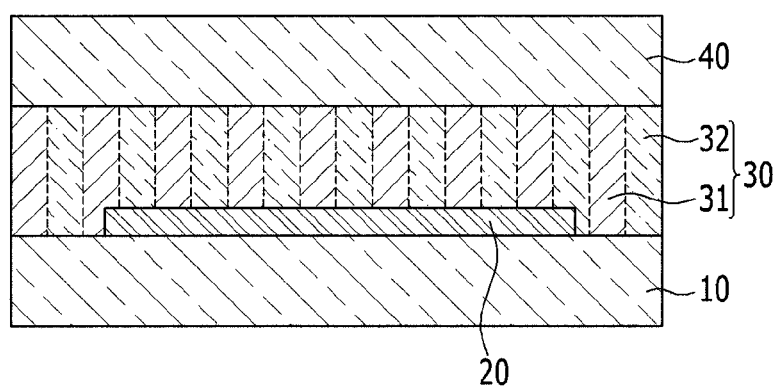
FIG. 1 schematically shows the cross-section of an organic light emitting diode (OLED) display according to one embodiment.

The present embodiments will be described more fully hereinafter with reference to the accompanying drawings, in which example embodiments are shown. As those skilled in the art would realize, the described embodiments may be modified in various different ways, all without departing from the spirit or scope of the present embodiments.

A part having no relationship with the description is omitted for clarity, and the same or similar constituent element is indicated by the same reference numeral throughout the specification.

The size and thickness of each constituent element as shown in the drawings are randomly indicated for better understanding and ease of description.

The size and thickness of each constituent element as shown in the drawings are exaggeratedly indicated for better understanding and ease of description.

In the drawings, the thickness of layers, films, panels, regions, etc., are exaggerated for clarity. In the drawings, the thicknesses of some layers and regions are exaggerated for better understanding and ease of description. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an example embodiment is described referring to FIGS. 1 and 2.

FIG. 1 is a cross-sectional view of an organic light emitting diode (OLED) display 100 according to one embodiment.

Referring to FIG. 1, the organic light emitting diode (OLED) display 100 includes a substrate 10, an organic light emitting element 20 disposed on the substrate 10, an encapsulation substrate 40 disposed on the organic light emitting element 20, and an adhesive layer 30 intervening between the substrate 10 and the encapsulation substrate 40.

The organic light emitting element 20 has an organic emission layer (not shown) which emits light, displays an image, and a driving circuit part (DC) (shown in FIG. 3) drives the organic light emitting element 20, and may be formed to have various structures. The driving circuit part (DC) drives the organic light emitting element 20. For example, the adhesive layer 30 may be formed a TFT substrate on which the organic light emitting element is formed.

To suppress moisture or oxygen penetration in the organic emission layer, the upper part of the organic light emitting element 20 is sealed with an encapsulation substrate 40 with an intervening adhesive layer 30. Specifically, on the substrate 10 on which the organic light emitting element 20 is formed, an adhesive layer 30 is formed so as to cover the organic light emitting element 20, and an encapsulation substrate 40 is formed thereon.

The encapsulation substrate 40 may include an insulator of a glass substrate or a plastic substrate, and the like, and if the encapsulation substrate comprises transparent material, the display may be used for top emission.

The adhesive layer 30 is formed by laminating a filling adhesive sheet including at least one opening which is punched in a vertical direction in the thickness of the adhesive layer and a heat dissipation adhesive sheet filling the opening, or by laminating a heat dissipation adhesive sheet including at least one opening that is open in a vertical direction in a thickness of the adhesive layer with a filling adhesive sheet filling the opening.

Figure 2:
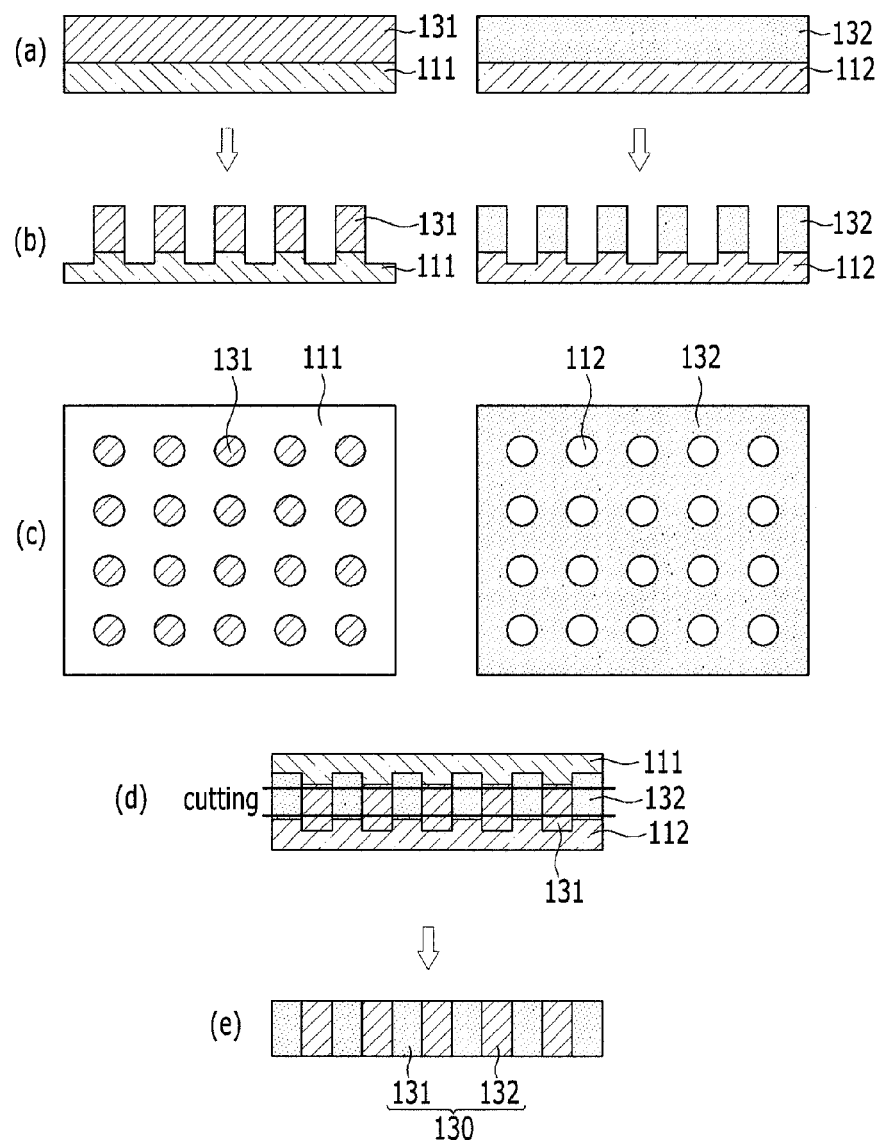
FIG. 2 schematically shows a manufacturing method of an adhesive layer that may be included in an organic light emitting diode (OLED) display according to another embodiment.

FIG. 2 schematically shows a manufacturing method of an adhesive layer according to an example embodiment.

First, a filling adhesive sheet 132 including a filling material is formed in a substrate film 111 (refer to (a) of FIG. 2), and then an opening is formed by punching a surface of the filling adhesive sheet 132 in a vertical direction (refer to (b) and (c) of FIG. 2). The opening may have diverse shapes. For example, the opening may have a shape of triangle, quadrangle, pentagon, hexagon, octagon, circle or a combination thereof. FIG. 2 illustrates a case where an opening having a circular cross section is formed in the filling adhesive sheet 132 (refer to (c) of FIG. 2). The opening may be formed according to a known method and the opening formation method is not limited to a particular method. For example, the opening is formed by cutting the filling adhesive sheet 132 through a punching process. Subsequently, the inside of the opening is removed from the filling adhesive sheet 132. In FIG. 2, (b) illustrates the cutting surface of the filling adhesive sheet 132 which is cut in a vertical direction, and (c) illustrates the surface of the filling adhesive sheet 132 shown from the top.

After a heat dissipation adhesive sheet 131 including a heat dissipation material is formed in the substrate film 112 (refer to (a) of FIG. 2), the heat dissipation adhesive sheet 131 is blanked in a vertical direction so as to form the protrusions and depressions which correspond oppositely to the protrusions and depressions of the filling adhesive sheet 132 (refer to (b) and (c) of FIG. 2). For example, the heat dissipation adhesive sheet 131 is cut in a pattern corresponding oppositely to the opening of the filling adhesive sheet 132 through a blanking process, and a part corresponding to the external part of the opening of the filling adhesive sheet 132 is removed from the heat dissipation adhesive sheet 131. FIG.

2(b) illustrates a cutting surface of the heat dissipation adhesive sheet 131 cut in a vertical direction, and (c) of FIG. 2 illustrates a surface of the heat dissipation adhesive sheet 131 shown from the top.

As described above, the filling adhesive sheet 132 and the heat dissipation adhesive sheet 131 that are punched and blanked to have their protrusions and depressions confront each other are laminated as shown in (d) of FIG. 2. After the lamination, an adhesive layer 130 may be formed by cutting along the cutting line illustrated in (d) of FIG. 2 to remove the substrate films 131 and 132 (refer to (e) of FIG. 2).

The adhesive layers 130 and 30 formed above include a heat dissipation adhesive part 31 and a filling adhesive sheet 32.

The cross-section of one opening formed in the filling adhesive sheet 132 may range from about 0.01 to about 5 cm$^2$. For example, the cross-section of one circle shown in (c) of FIG. 2 may range from about 0.01 to about 1 cm$^2$. Also, the area of a cross-section of the opening occupying in one cross-section of the filling adhesive sheet 132 may range from about 10% to about 80% of a cross-section of the filling adhesive sheet 132. According to another embodiment, the area of a cross-section of the opening occupying in one cross-section of the filling adhesive sheet 132 may range from about 10% to about 50%. Since the opening is eventually filled with the heat dissipation adhesive sheet 132, the cross-sectional ratio determines the content ratio of the heat dissipation adhesive part 31 and the filling adhesive sheet 32 in the adhesive layer 30 that is formed as a result of the opening filled with the heat dissipation adhesive sheet 132. When the cross-section has a ratio of the above range, the adhesive layer 30 may be given with an appropriate combination of the characteristics originating from the heat dissipation adhesive part 31 and the characteristics originating from the filling adhesive sheet 32.

The heat dissipation adhesive part 31 includes a heat dissipation material, and the filling adhesive sheet 32 includes a filling material. The adhesive layer 30 includes a heat dissipation material having heat dissipation characteristics of diffusing the heat generated from an organic light emitting element to the outside as soon as the substrate 10 including the organic light emitting element 20 formed therein is bonded with an encapsulation substrate 40 and a filling material that has barrier characteristics against external moisture and blocks the moisture entering from the outside. Therefore, the adhesive layer 30 protects the organic light emitting element 20 from water so as to improve the life-span of the organic light emitting element 20.

The heat dissipation adhesive sheet 131 and the filling adhesive sheet 132 may comprise a composition prepared by mixing a thermally curable resin or photocurable resin with a heat dissipation material or filling material. The composition is described later.

When the heat dissipation adhesive sheet 131 and the filling adhesive sheet 132 comprise a composition including a thermally curable resin or photocurable resin of the same kind, the adhesive layer 30 that comprises the composition and includes the heat dissipation adhesive part 31 and the filling adhesive sheet 32 may be formed as one sheet without forming an interface between the heat dissipation adhesive part 31 and the filling adhesive sheet 32.

The heat dissipation adhesive part 31 may include a heat dissipation material of graphite, $Al_2O_3$, carbon nanotube (CNT), carbon, and the like.

The filling material that may be used in the filling adhesive sheet 32 realizes barrier characteristic to moisture. It is not specifically limited as long as it may act as a filler having barrier characteristic in the adhesive layer 30 of filling material, and specific examples thereof may include talc, silica, magnesium oxide, mica, montmorillonite, alumina, graphite, beryllia (beryllium oxide), aluminum nitride, silicon carbide, mullite, silicon, and a combination thereof, but are not limited thereto. The filling material may be a particle prepared by synthesis or it may be a particle prepared by processing gemstone.

The filling material included in a resin composition for the filling adhesive sheet 32 is uniformly dispersed in the composition after curing, and thus, it may distribute stress acting on the composition to reinforce adhesion, and may effectively block moisture penetrated and diffused in the composition so that the moisture may not pass the filling adhesive sheet 32 and be diffused to the organic light emitting element 20

The heat dissipation material or filling material may have a particle diameter of about 10 nm to about 20 μm, respectively. For example, the heat dissipation material may have an average particle diameter of about 10 nm to about 100 nm. For example, the filling material may have an average particle diameter of about 2 μm to about 5 μm.

The heat dissipation material or the filling material may be mesoporous, plate-shaped, spherical, rod-shaped, fiber-shaped, core-shell typed, and the like, but is not limited thereto.

The heat dissipation adhesive part 31 may include about 5 to about 50 parts by weight, and specifically about 10 to about 30 parts by weight heat dissipation material based on about 100 parts by weight of a thermally curable resin or a photocurable resin. When the heat dissipation adhesive part 31 includes heat dissipation material in an amount of about 5 to about 50 parts by weight based on about 100 parts by weight of a thermally curable resin or photocurable resin, a path for dissipating heat to the outside may be formed.

The filling adhesive sheet 32 may include a filling material in an amount of about 5 to about 50 parts by weight based on about 100 parts by weight of the thermally curable resin or photocurable resin. According to one embodiment, the filling adhesive sheet 32 may include the filling material in an amount of about 10 to about 30 parts by weight. When the filling adhesive sheet 32 includes a heat dissipation material in an amount of about 5 to about 50 parts by weight based on about 100 parts by weight of a thermally curable resin or photocurable resin, barrier characteristics against moisture may be achieved.

The adhesive layer 30 may have a thickness of about 5 μm to about 50 μm. For example, the adhesive layer 30 may have a thickness of 10 μm, 20 μm or 30 μm. When the thickness of the adhesive layer 30 is within the above range, it may not be influenced by surface level difference and adhesion property may be secured.

The organic light emitting diode (OLED) display 100 may improve reliability of the organic light emitting element 20 by including the adhesive layer 30. If the material of the encapsulation substrate is not glass, moisture and the like may be incorporated through a defect part of pin-holes and pores formed by particles, but the heat dissipation adhesive part 31 in the adhesive layer 30 may absorb or adsorb the moisture, or the filling adhesive sheet 32 may block the moisture to protect the organic light emitting element 20.

In general, to protect the organic light emitting element 20 from moisture incorporated from outside, a getter may be coated on the outer part, but the organic light emitting diode (OLED) display 100 may be dispensed with it to shorten the process. If a getter forming process is skipped, a getter line may not be formed on the outer part and thus margin may be secured to reduce bezel.

The total thickness may be decreased and the process of stacking a heat dissipation adhesive layer may be omitted, compared with a case where the organic light emitting display element 100 including the adhesive layer 30 has a heat dissipation adhesive layer as a separate layer. As a result, the process may be simplified. In other words, the use of the adhesive layer 30 including the heat dissipation adhesive part 31 and the filling adhesive sheet 32 as one integrated sheet is advantageous in terms of process and structure.

As described above, when the adhesive layer 30 is formed as a lamination of the heat dissipation adhesive part 31 and the filling adhesive sheet 32, the substrate 10, the organic light emitting element 20, and the encapsulation substrate 40 may be bonded by maintaining adhesion strength while effectively preventing moisture entering from the encapsulation substrate 40 to the organic light emitting element 20. The adhesive layer 30 may effectively block moisture incorporated to the organic light emitting element 20 without decreasing adhesion characteristic, to increase reliability of the organic light emitting element 20 and improve life-span.

As described above, the heat dissipation adhesive part 31 and the filling adhesive sheet 32 may comprise a composition containing the heat dissipation material or composition including a filling material. The composition for forming the heat dissipation adhesive part 31 and the filling adhesive sheet 32 may include a thermally curable resin or photocurable resin. The composition may include a thermally curing agent, a cure accelerating agent, a coupling agent, a spacer, a photoacid generator, a radical initiator or a combination thereof as an additive, and the composition also include a solvent.

When the composition for forming the heat dissipation adhesive part 31 and the filling adhesive sheet 32 is prepared using a thermally curable resin composition, the composition may include a thermally curable resin, a thermally curing agent, a cure accelerating agent, a coupling agent, an antioxidant and a solvent, and the composition may further include a heat dissipation material or filling material.

The thermally curable resin may include epoxy resin. The epoxy resin may include bisphenol-based epoxy, ortho-cresol novolac, multi-functional epoxy, amine-based epoxy, heterocyclic epoxy, substituted epoxy, and naphthol-based epoxy, specifically, bisphenol A epoxy resin, bisphenol F epoxy resin, hydrogenated bisphenol type epoxy resin, alicyclic epoxy resin, aromatic epoxy resin, novolac, dicyclopentadiene type epoxy resin, and a combination thereof. Currently available epoxy resin includes a bisphenol-based epoxy resin such as EPICLON 830-S, EPICLON EXA-830CRP, EPICLON EXA 850-S, EPICLON EXA-850CRP, and EPICLON EXA-835LV (Dainippon Ink & Chemicals Inc.); EPIKOTE 807, EPIKOTE 815, EPIKOTE 825, EPIKOTE 827 EPIKOTE 828, EPIKOTE 834, EPIKOTE 1001, EPIKOTE 1004, EPIKOTE 1007, and EPIKOTE 1009 (Yuka Shell Epoxy Co.) DER-330, DER-301, DER-361 (DOW Chemical Company), YD-128, YDF-170, and the like (KUKDO CHEMICAL CO. LTD.); an ortho-cresol novolac-based epoxy resin such as YDCN-500-1P, YDCN-500-4P, YDCN-500-5P, YDCN-500-7P, YDCN-500-80P, YDCN-500-90P (KUKDO CHEMICAL CO. LTD.), EOCN-102S, EOCN-103S, EOCN-104S, EOCN-1012, EOCN-1025, EOCN-1027, and the like (Nippon Kayaku Co. Ltd.); a multi-functional epoxy resin such as Epon 1031S (Yuka Shell Epoxy Co.), ALALDITE 0163 (Ciba Specialty Chemicals Corp.), DENACOL EX-611, DENACOL EX-614, DENACOL EX-614B, DENACOL EX-622, DENACOL EX-512, DENACOL EX-521, DENACOL EX-421, DENACOL EX-411, DENACOL EX-321, and the like (Nagase ChemteX Corporation); an amine-based epoxy resin such as EPIKOTE 604 (Yuka Shell Epoxy Co.), YH-434 (KUKDO CHEMICAL CO. LTD.), TETRAD-X, TETRAD-C (Mitsubishi Gas Chemical Company, Inc.), ELM-120 (Sumitomo Chemical Co., Ltd.), and the like, a heterocyclic epoxy resin such as PT-810 (Ciba Specialty Chemicals Corp.); a substituted epoxy resin such as ERL-4234, ERL-4299, ERL-4221, ERL-4206 (Union Carbide Corp.) and a naphthol-based epoxy resin such as EPICLON HP-4032, EPICLON HP-4032D, EPICLON HP-4700, EPICLON 4701 (Dainippon Ink & Chemicals Inc.). These may be used singularly or as a mixture of two or more. To obtain excellent film coating characteristic, a phenoxy resin may be applied, and a high molecular weight resin such as EPIKOTE 1256 (Japan Epoxy Resins Co., Ltd.) and PKHH (InChem. Co.), YP-70 (KUKDO CHEMICAL CO. LTD.), and the like may be applied.

As the thermally curing agent, commonly used one for thermally curing epoxy resin may be used without specific limitation. Specific examples of the thermally curing agent include a polyamine-based curing agent such as diethylenetriamine, triethylenetetramine, N-aminoethylpiperazine, diamino diphenylmethane, sebacic acid dihydrazide, and the like; an acid anhydride curing agent such as phthalic anhydride, phthalic tetrahydroanhydride, phthalic hexahydroanhydride, phthalic methyltetrahydroanhydride, phthalic methylhexahydroanhydride, methyl nadic anhydride, and the like; a phenolnovolac curing agent; a polymercaptan curing agent such as trioxanetrimethylenemercaptan, and the like; a tertiary third amine compound such as benzyldimethylamine, 2,4,6-tris(dimethylaminomethyl)phenol, and the like; an imidazole compound such as 2-methylimidazole, 2-ethyl-4-methylimidazole, 1-benzyl-2-methylimidazole, and the like. A solid dispersion type potential curing agent or a potential curing agent encapsulated in a microcapsule, and the like may be used.

If an amine-based curing agent is used, aliphatic amine, modified aliphatic amine, aromaticamine, secondary amine or tertiary amine, and the like may be used, and for example, benzyldimethylamine, triethanolamine, triethylene tetramine, diethylenetriamine, triethyleneamine, dimethylaminoethanol, tri(dimethylaminomethyl)phenol, and the like may be used, or a curing agent having —OH, —COOH, —SO$_3$H, —CONH$_2$, —CONHR (R represents an alkyl group), —CN (CN)NH$_2$, —SO$_3$NH$_2$, —SO$_3$NHR (R represents an alkyl group) or —SH at the end group may be used. The R may be a C1-C10 alkyl group, for example, a C1-C10 linear or branch saturated hydrocarbon group, particularly C1-C4 linear or branched alkyl group, and more particularly methyl, ethyl, n-propyl, isopropyl, isobutyl, n-butyl, and t-butyl.

The imidazole-based curing agent may include imidazole, isoimidazole, 2-methyl imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole, an addition product of imidazole and methylimidazole, an addition product of imidazole and trimellitic acid, 2-n-heptadecyl-4-methylimidazole, phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethyl-aminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole and 2-p-methoxystyrylimidazole.

The acid anhydride curing agent is an epoxy resin, specifically a hybrid epoxy resin including siloxane.

More particularly, the acid anhydride curing agent may include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, methyltetrahydrophthalic anhydride or 5-(2,5-dioxotetrahydrol)-3-methyl-3-cyclohexene-1,2-dicarboxylic acidanhydride.

The cure accelerating agent may include a quaternary ammonium salt, a quaternary sulfonium salt, various metal salts, imidazole, tertiary amine, and the like. Examples of the quaternary ammonium salt include tetra methyl ammonium bromide, tetrabutylammoniumbromide, and the like, examples of the quaternary sulfonium salt include tetra phenyl phosphonium bromide, tetrabutylphosphoniumbromide, examples of the metal salt may include zinc octylate, tin octylate, and the like, examples of the imidazole may include 1-benzyl-2-methyl imidazole, 1-benzyl-2-phenyl imidazole, 2-ethyl-4-methyl imidazole, and the like, and examples of the tertiary amine may include benzyl dimethyl amine, and the like.

The boron-based cure accelerating agent may include phenylboronic acid, 4-methylphenylboronic acid, 4-methoxyphenyl boronic acid, 4-trifluoromethoxyphenyl boronic acid, 4-tert-butoxyphenyl boronic acid, 3-fluoro-4-methoxyphenyl boronic acid, pyridine-triphenylborane, 2-ethyl-4-methyl imidazolium tetraphenylborate, 1,8-diazabicyclo[5.4.0]undecene-7-tetraphenylborate, 1,5-diazabicyclo[4.3.0]nonene-5-tetraphenylborate, lithium triphenyl(n-butyl)borate), and the like, the imidazole-based cure accelerating agent may include 2-methylimidazole, 2-undecylimidazole, 2-heptadecylimidazole, 2-ethyl-4-methylimidazole, 2-phenylimidazole, 2-phenyl-4-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium-trimellitate, 1-cyanoethyl-2-phenylimidazolium-trimellitate, 2,4-diamino-6-[2'-methylimidazoly-1']-ethyl-s-triazine, 2,4-diamino-6-[2'-undecylimidazoly-1']ethyl-s-triazine, 2,4-diamino-6-[2'-ethyl-4'-methylimidazoly-1]-ethyl-s-triazine, 2,4-diamino-6-[2'-methylimidazoly-1']ethyl-s-triazine isocyanuric acid adduct dihydrate, a 2-phenylimidazole isocyanuric acid adduct, 2-methylimidazole isocyanuric acid adduct dihydrate, 2-phenyl-4,5-dihydroxymethylimidazole, 2-phenyl-4-methyl-5-hydroxymethylimidazole, 2,3-dihyro-1H-pyrrolo[1,2-a]benzimidazole, 4,4'-methylene bis(2-ethyl-5-methylimidazole), 2-methylimidazoline, 2-phenylimidazoline, 2,4-diamino-6-vinyl-1,3,5-triazine, a 2,4-diamino-6-vinyl-1,3,5-triazine isocyanuric acid adduct, a 2,4-diamino-6-methacryloyloxylethyl-1,3,5-triazineisocyanuric acid adduct, 1-(2-cyanoethyl)-2-ethyl-4-methylimidazole, 1-cyanoethyl-2-methylimidazole, 1-(2-cyanoethyl)-2-phenyl-4,5-di-(cyanoethoxymethyl)imidazole, 1-acetyl-2-phenylhydrazine, 2-ethyl-4-methylimidazoline, 2-benzyl-4-methyl dimidazoline, 2-ethyl imidazoline, 2-pheny imidazole, 2-phenyl-4,5-dihydroxymethylimidazole, melamine, dicyandiamide, and the like, and this boron-based cure accelerating agent may be used singularly or as a mixture of two or more.

The coupling agent may include a silane coupling agent, a titanate-based coupling agent, an aluminate-based coupling agent, a silicon compound, and the like, and the coupling agent may be used singularly or as a mixture thereof. The coupling agent may improve adhesion of a resin composition and decrease viscosity, and it may be included in an amount of about 0.001 to about 5 parts by weight, more particularly about 0.01 to about 3 parts by weight, based on 100 parts by weight of the thermally curable resin in the thermally curable resin composition.

The silane coupling agent functions as an adhesion improving agent for improving adhesion between the surface of inorganic material such as silica and a resin in the composition. The silane coupling agent may include epoxy containing silane or mercapto containing silane, and the like, wherein the epoxy containing silane may include 2-(3,4 epoxy cyclohexyl)-ethyltrimethoxysilane, 3-glycidoxytrimethoxy silane, 3-glycidoxypropyltriethoxysilane, 3-glycidoxypropyltriethoxysilane, an amine group containing silane may include N-2(aminoethyl)-3-aminopropylmethyldimethoxysilane, N-2(aminoethyl)-3-aminopropyltrimethoxysilane, N-2(aminoethyl)3-aminopropyltriethoxysilane, 3-aminopropyltrimethoxysilane, 3-aminopropyltriethoxysilane, 3-triethoxysily-N-(1,3-dimethylbutylidene)propylamine, N-phenyl-3-aminopropyltrimethoxysilane, the mercapto containing silane may include 3-mercaptopropylmethyldimethoxysilane, 3-mercaptopropyltriethoxysilane, and an isocyanate containing silane may include 3-isocyanatepropyltriethoxysilane, and the silane coupling agent may be used singularly or as a mixture thereof.

The antioxidant may prevent oxidation degradation during thermal curing of the thermally curable resin composition, thereby further improving thermal stability of the cured product. The antioxidant may include a phenol based antioxidant, a sulfur based antioxidant, a phosphorous based antioxidant, and the like. The phenol based antioxidant may include dibutyl hydroxy toluene, 2,6-di-tetra-butyl-p-cresol (hereinafter, referred to as BHT), and the like, the sulfur based antioxidant may include mercapto propionic acid derivative, and the like, the phosphorous based antioxidant may include triphenylphosphite, 9,10-dihydro-9-oxa-10-phosphaphenanthrene-10-oxide (hereinafter, HCA), and the like, and the antioxidant may be used singularly or as a mixture thereof. And, it may be included in an amount of about 0.001 to about 5 parts by weight, more particularly about 0.01 to about 0.5 parts by weight, based on 100 parts by weight of the thermally curable resin in the thermally curable resin composition.

If the composition for manufacturing the heat dissipation adhesive part 31 or the filling adhesive sheet 32 is prepared as a photocuarble resin composition, it may include a heat dissipation material or a filling material in addition to a photocurable epoxy resin, a photoinitiator, a coupling agent, a spacer, a photoacid generator, a radical generator and a solvent.

The photocurable epoxy resin that may be applied for the photocurable resin composition may include a commonly used aromatic epoxy resin, an alicyclic epoxy resin, and a mixture thereof. The aromatic epoxy resin may include a biphenyl type, bisphenol A type, bisphenol F type, phenol novolac, dicyclopentadiene epoxy resin, and the like, and a mixture thereof.

The photoinitiator is not specifically limited as long as it may photocure the epoxy resin. The photoinitiator may include an aromatic diazonium salt, an aromatic sulfonium salt, an aromatic iodine aluminum salt, an aromatic sulfonium aluminum salt, a metallocene compound and an iron complex salt. More particularly, an aromatic sulfonium salt may be used, and specific examples thereof may include an aromatic sulfonium hexafluoro phosphate compound, an aromatic sulfonium hexafluoro antimonate compound, and the like.

As the coupling agent, a silane-based or a titan-based coupling agent, and a silicon compound may be used alone or in combination. More particularly, a silane coupling agent containing alkoxysilane and diglycidylether in one molecule may be used.

The spacer is not specifically limited as long as it may constantly maintain the thickness of a panel after curing, and particularly, a spacer capable of maintaining the thickness of a panel about 5 to about 50 μm, more particularly about 5 to about 25 μm may be used. The spacer may have a spherical shape, a log shape, and the like, and the shape of the spacer is not specifically limited as long as it may constantly maintain the thickness of a panel.

The photoacid generator is not specifically limited as long as it may produce Lewis acid or Bronsted acid by exposure, and a sulfide salt based compound such as organic sulfonic acid, and onium based compound such as onium salt may be used. More specific examples include phthimidotrifluoromethanesulfonate, dinitrobenzyltosylate, n-decyldisulfone, naphthylimidotrifluoromethanesulfonate, diphenyl iodide, hexafluorophosphate, diphenyl iodide, hexafluoroarsenate, diphenyl iodide, hexafluoroantimonate, diphenylparamethoxyphenylsulfonium triflate, diphenylparatoluenylsulfonium triflate, diphenylparaisobutylphenylsulfonium triflate, triphenylsulfonium hexafluoro arsenate, triphenylsulfonium hexafluoro antimonate, triphenylsulfonium triflate, dibutylnaphthylsulfonium triflate, and a mixture thereof.

The radical initiator may be used together with the photoacid generator, and it may include a radical photopolymerization initiator that is decomposed by electromagnetic energy ray such as UV ray thereby producing a radical, and a thermally degradable radical polymerization initiator that is decomposed by heat to produce a radical. The radical photopolymerization initiator may include a type I alpha cleavage initiator such as an acetophenone derivative such as 2-hydroxy-2-methylpropinophenone and 1-hydroxycyclohexyl phenyl ketone; an acylphosphine oxide derivative such as bis(2,4,6-trimethylbenzoyl)phenylphosphine oxide; a benzoin ether derivative such as benzoin methyl ether and benzoin ethyl ether, and the like. Representative examples of a commercially available radical photoinitiator may include IRGACURE 651, IRGACURE 184, IRGACURE 907, DAROCUR 1173 and IRGACURE 819 (Ciba Specialty Chemicals corp.)

A type II photoinitiator may be also used, and the examples may include a compound such as benzophenone, isopropylthioxanthone and anthraquinone. Variously substituted derivatives of the basic compounds may also be used. The thermally decomposable radical polymerization initiator may include peroxides such as 1,1,3,3-tetramethylbutylperoxy-2-ethyl-hexanoate, 1,1-bis(t-butylperoxy)cyclohexane, 1,1-bis(t-butylperoxy)cyclo-dodecane, di-t-butylperoxyisophthalate, t-butylperoxybenzoate, dicumylperoxide, t-butylcumylperoxide, 2,5-dimethyl-2,5-di(t-butylperoxy)hexane, 2,5-dimethyl-2,5-di(t-butylperoxy)-3-hexyne, and cumene hydroperoxide. The radical polymerization initiator may be included in an effective amount, for example, about 0.01 to about 5 parts by weight based on 100 parts by weight of the photocurable resin in the photocurable resin composition.

The solvent that may be used in the composition for manufacturing the heat dissipation adhesive part 31 or the filling adhesive sheet 32 may include methylethylketone (MEK), tetrahydrofuran (THF), toluene, and the like, it is not specifically limited as long as it may form a solution for forming a film, and it may be used alone or in a mixture of two or more kinds to obtain excellent film characteristic.

An adhesive layer 30 may be formed by coating the substrate films 111 and 112 with the composition for forming the heat dissipation adhesive part 31 and the filling adhesive sheet 32, drying the coated substrate films 111 and 112 to form sheets, and laminating the two sheets with each other through a process illustrated in FIG. 2. The lamination method described in FIG. 2 may be any method that may form the adhesive layer 30 including the heat dissipation adhesive part 31 and the filling adhesive sheet 32 and it is not limited to a specific method and it may be a widely known method.

The substrate 110 including the organic light emitting element 120 formed therein is bonded with the encapsulation substrate 140 by using the adhesive layers 30 and 130 formed as described above. The bonding method may be a widely known method and it is not limited to a specific method. For example, it may be a lamination process, a press process, or a diaphragm process. Subsequently, the adhesive layer 30 including the heat dissipation adhesive part 31 and the filling adhesive sheet 32 may be thermally cured or photocurable. Also, the heat dissipation adhesive sheet 131 and the filling adhesive sheet 132 may be formed in the form of uncured gel, solid, or liquid and then go through a subsequent process, if they may form sheet and realizes the characteristics.

According to another embodiment, a method for manufacturing an organic light emitting diode (OLED) display includes: providing an organic light emitting element on a substrate; cutting a filling adhesive sheet to form an opening and removing the inside of an opening; cutting a heat dissipation adhesive sheet to correspond to the opening of the filling adhesive sheet, and removing an exterior of the part corresponding to the opening in such a manner that protrusions and depressions of the heat dissipation adhesive sheet are engaged with protrusions and depressions of the filling adhesive sheet; forming an adhesive layer by laminating the filling adhesive sheet and the heat dissipation adhesive sheet that are cut in such a manner that the protrusions and depressions of the heat dissipation adhesive sheet are engaged with the protrusions and depressions of the filling adhesive sheet; and interposing the adhesive layer between the substrate including the organic light emitting element formed therein and an encapsulation substrate and bonding the substrate including the organic light emitting element formed therein with the encapsulation substrate.

As described above, a punching process, a blanking process, a floating knife process, etc and a combination thereof may be performed to cut the filling adhesive sheet to form an opening or to cut the heat dissipation adhesive sheet to form a part corresponding to the opening of the filling adhesive sheet. This disclosure is not limited to it and a widely known method may be used.

A process of curing the adhesive layer may be further included after the substrate including the organic light emitting element formed therein and the encapsulation substrate are bonded with the adhesive layer interposed between them. The curing performed after the lamination is performed for the adhesive layer to include the heat dissipation adhesive part and filling adhesive part enhance the lamination to be firm. If the adhesive layer may be realized in the form of sheet without being cured, the curing process may not be carried out.

The following examples illustrate the present embodiments in more detail. These examples, however, are not in any sense to be interpreted as limiting the scope of the present embodiments.

EXAMPLE

Example 1

About 30 parts by weight of epoxy resin EXA-835LV (Dainippon Ink & Chemicals Inc.), about 40 parts by weight of a phenoxy resin EPIKOTE-1256 (Japan Epoxy Resins Co. Ltd.), about 5 parts by weight of a thermally curing agent C11Z-CNS (Shikoku Chemicals Corp.), about 20 parts by weight of alumina AL-M43 (Sumitomo Chemical Co., Ltd.) (particle diameter: about 1 to 2 µm), a silane coupling agent KBM-403 (Shinetsu), and about 100 parts by weight of methylethylketone (MEK) as an organic solvent were mixed to prepare a composition for a filling adhesive sheet, and the composition was coated on a PET substrate film to a thickness of about 20 µm to manufacture a heat dissipation adhesive sheet.

On the other hand, about 30 parts by weight of epoxy resin EXA-835LV (Dainippon Ink & Chemicals Inc.), about 45 parts by weight of a phenoxy resin EPIKOTE-1256 (Japan Epoxy Resins Co. Ltd.), about 5 parts by weight of a thermally curing agent C11Z-CNS (Shikoku Chemicals Corp.), about 15 parts by weight of Talc D-1000 (Nippon Talc Co., Ltd.) (particle diameter: about 1 to 2 µm), a silane coupling agent KBM-403 (Shinetsu), and about 100 parts by weight of an organic solvent MEK were mixed to prepare a composition for a filling adhesive sheet, and then, the composition was coated on a PET substrate film to a thickness of about 20 µm to manufacture a filling adhesive sheet.

A punching process was performed onto the filling adhesive sheet to form an opening by cutting the filling adhesive sheet in a circular shape having a cross-section of about 0.25 cm$^2$ on the basis of a filling adhesive sheet unit area of about 1 cm$^2$, and the inside of the opening was removed using a needle. Similarly, a blanking process is performed onto the heat dissipation adhesive sheet prepared above in the same shape, and then an external portion corresponding to the opening of the filling adhesive sheet was removed using a niddle.

An adhesive layer was formed by laminating the filling adhesive sheet and the heat dissipation adhesive sheet that include protrusions and depressions in such a manner that the protrusions and depressions are engaged with each other.

An organic light emitting element was formed on a glass substrate, the above manufactured adhesive layer was intervened between the substrate and a glass encapsulation substrate so as to cover the organic light emitting element, and they were bonded at a pressure of about 60 Kpa with a diaphragm to manufacture an organic light emitting diode (OLED) display.

Example 2

An organic light emitting diode (OLED) display was manufactured according to the same method as in Example 1, except that about 40 parts by weight of AES-11C (Sumitomo Chemical Co., Ltd.) and 20 parts by weight of AL-M43 (Sumitomo Chemical Co., Ltd.) as alumina were used.

Example 3

An organic light emitting diode (OLED) display was manufactured according to the same method as in Example 1, except that about 50 parts by weight of AES-11C (Sumitomo Chemical Co., Ltd.), and about 50 parts by weight of AL-M43 (Sumitomo Chemical Co., Ltd.) as alumina were used.

Example 4

An organic light emitting diode (OLED) display was manufactured according to the same method as in Example 1, except that about 20 parts by weight of AMS-9 (Sumitomo Chemical Co., Ltd.), about 40 parts by weight of AL-M43 (Sumitomo Chemical Co., Ltd.), and about 30 parts by weight of AL-M41 as alumina were used.

Example 5

An organic light emitting diode (OLED) display was manufactured according to the same method as in Example 1, except that about 20 parts by weight of AMS-9 (Sumitomo Chemical Co., Ltd.), about 30 parts by weight of AL-M43 (Sumitomo Chemical Co., Ltd.), and about 30 parts by weight of AL-M41 as alumina were used.

Comparative Example 1

An organic light emitting diode (OLED) display was manufactured according to the same method as in Example 1, except that the filling adhesive sheet was used as an adhesive layer.

Experimental Example 1

Life-Span Test

The organic light emitting diode (OLED) displays manufactured in Examples 1 to 5 and Comparative Example 1 were introduced in a chamber (TH-TG JEIO TECH. CO., Ltd.) of about 85° C. about 85% RH (relative humidity), light emitting parts were observed according to time, and a time until a blind spot was generated was measured and described in the following Table 1.

Experimental Example 2

Water Vapor Transmission Rate

For the film type adhesive layers manufactured in Examples 1 to 5 and Comparative Example 1, water vapor transmission rate (WVTR) was measured (measuring instrument: Mocon Inc. permatran3/33ma).

Experimental Example 3

Adhesion Strength

For the adhesive layers manufactured in Examples 1 to 5 and Comparative Example 1, two specimens were stacked in a cross shape and bonded, and then, strength for detaching both specimens was measured using UTM (INSTRON, model-5900) thereby measuring adhesion strength.

TABLE 1

|  | Example 1 | Example 2 | Example 3 | Example 4 | Example 5 | Comparative Example 1 |
|---|---|---|---|---|---|---|
| WVTR g/m$^2$ | 10 | 10 | 10 | 10 | 10 | 10 |
| Adhesion strength (kgf/cm$^2$) | 27 | 28 | 28 | 30 | 30 | 23 |
| Thermal conductivity (W/mK) | 2.6 | 2.1 | 4.6 | 4.7 | 4.2 | 0.52 |
| Blind spot generation time (hours) | 1,432 | 1,320 | 1,635 | 1,798 | 1,532 | 702 |

While this disclosure has been described in connection with what is presently considered to be practical example embodiments, it is to be understood that the embodiments are not limited to the disclosed embodiments, but, on the contrary, is intended to cover various modifications and equivalent arrangements included within the spirit and scope of the appended claims.

What is claimed is:

1. An organic light emitting diode (OLED) display, comprising
   a substrate;
   an organic light emitting element disposed on the substrate;
   an encapsulation substrate disposed on the organic light emitting element; and
   an adhesive layer disposed on and contacting the substrate and the encapsulation substrate covering the organic light emitting element and bonding the substrate including the organic light emitting element disposed therein with the encapsulation substrate,
   wherein the adhesive layer comprises a filling adhesive sheet including at least one opening that passes through the filling adhesive sheet in a vertical direction in a thickness of the adhesive layer with a heat dissipation adhesive sheet comprising a different material than the filling adhesive sheet filling the opening, or a heat dissipation adhesive sheet including at least one opening that passes through the heat dissipation adhesive sheet in a vertical direction in a thickness of the adhesive layer with a filling adhesive sheet filling the opening.

2. The organic light emitting diode (OLED) display of claim 1, wherein the opening has a cross-section of about 0.01 to about 5 cm$^2$.

3. The organic light emitting diode (OLED) display of claim 1, wherein the opening has a cross-section of triangle, quadrangle, pentagon, hexagon, octagon, circle or a combination thereof.

4. The organic light emitting diode (OLED) display of claim 1, wherein an area of the cross-section of the opening occupying in a cross-section of the filling adhesive sheet or the heat dissipation adhesive sheet ranges from about 10% to about 80% of the filling adhesive sheet of the heat dissipation adhesive sheet.

5. The organic light emitting diode (OLED) display of claim 1, wherein the heat dissipation adhesive sheet comprises at least one heat dissipation material selected from the group consisting of Al$_2$O$_3$, carbon nanotube (CNT), and graphite.

6. The organic light emitting diode (OLED) display of claim 5, wherein the heat dissipation material or the filling material have a particle diameter of about 10 nm to about 20 µm, respectively.

7. The organic light emitting diode (OLED) display of claim 5, wherein the heat dissipation material or the filling material is mesoporous, plate-shaped, spherical, rod-shaped, fiber-shaped, or core-shell typed.

8. The organic light emitting diode (OLED) display of claim 1, wherein the filling adhesive sheet comprises at least one filling material selected from the group consisting of talc, silica, magnesium oxide, mica, montmorillonite, alumina, graphite, beryllia (beryllium oxide), aluminum nitride, silicon carbide, mullite, and silicon.

9. The organic light emitting diode (OLED) display of claim 8, wherein the heat dissipation material or the filling material have a particle diameter of about 10 nm to about 20 µm, respectively.

10. The organic light emitting diode (OLED) display of claim 8, wherein the heat dissipation material or the filling material is mesoporous, plate-shaped, spherical, rod-shaped, fiber-shaped, or core-shell typed.

11. The organic light emitting diode (OLED) display of claim 1, wherein the adhesive layer comprises a thermally curable resin or a photocurable resin.

12. The organic light emitting diode (OLED) display of claim 1, wherein the heat dissipation sheet and the filling adhesive sheet comprises the same kind of thermally curable resin or photocurable resin so that the adhesive layer is formed as one integrated sheet without forming an interface between the heat dissipation sheet and the filling adhesive sheet.

13. The organic light emitting diode (OLED) display of claim 1, wherein the heat dissipation adhesive sheet comprises:
   about 100 parts by weight of a thermally curable resin or photocurable resin; and
   about 5 to about 50 parts by weight of a heat dissipation material.

14. The organic light emitting diode (OLED) display of claim 1, wherein the filling adhesive sheet comprises about 100 parts by weight of a thermally curable resin or photocurable resin; and about 5 to about 50 parts by weight of a filling material.

15. The organic light emitting diode (OLED) display of claim 1, wherein the adhesive layer has a thickness of about 5 µm to about 50 µm.

16. The organic light emitting diode (OLED) display of claim 1, wherein the heat dissipation adhesive sheet comprises a heat dissipation material, the filling adhesive sheet comprises a filling material, and the heat dissipation material and filling material are present at a weight ratio of about 10:1 to about 1:10 in the adhesive layer.

* * * * *